United States Patent [19]

Yamakawa et al.

[11] Patent Number: 4,954,786

[45] Date of Patent: Sep. 4, 1990

[54] OPTICAL AMPLIFYING DEVICE

[75] Inventors: Hideaki Yamakawa; Nobuo Suzuki, both of Tokyo; Takeshi Ozeki, Saitama, all of Japan

[73] Assignee: Kabushiki Kaisha Toshiba, Kawasaki, Japan

[21] Appl. No.: 446,095

[22] Filed: Dec. 5, 1989

[30] Foreign Application Priority Data

Jan. 12, 1989 [JP] Japan .................................. 1-5422

[51] Int. Cl.⁵ .......................... G01J 1/32; H01S 3/103
[52] U.S. Cl. ....................... 330/4.3; 372/31; 250/205
[58] Field of Search ............. 330/4.3; 332/7.51; 369/116; 372/25, 31, 38, 46; 455/611, 613; 250/205, 214 A, 214 C

[56] References Cited

U.S. PATENT DOCUMENTS

| Re. 31,969 | 8/1985 | Sell | 372/38 |
|---|---|---|---|
| 3,395,367 | 7/1968 | Bell et al. | 372/31 |
| 3,770,966 | 11/1973 | Seigawa et al. | 250/205 |
| 3,780,296 | 12/1973 | Wahsberg et al. | 372/31 |
| 4,399,566 | 8/1983 | Raullet et al. | 455/613 |
| 4,484,144 | 11/1984 | Nakagome et al. | 330/4.3 |
| 4,608,697 | 8/1986 | Coldren | 372/32 |
| 4,675,518 | 6/1987 | Oimura et al. | 250/205 |
| 4,730,105 | 3/1988 | Mitschke et al. | 250/205 |
| 4,812,776 | 3/1989 | Susaki | 330/4.3 |
| 4,879,459 | 11/1989 | Negishi | 250/205 |

OTHER PUBLICATIONS

Roshan, P. P.; "Laser Modulation Control Method"; IBM Tech. Disc. Bull., vol. 12, #3, 8/69, p. 485.

A. Ellis, D. Malyon et al., "Novel All Electrical Scheme for Laser Amplifier Gain Control", European Conference on Optical Communication (ECOC'88), pp. 487–490.

*Primary Examiner*—Nelson Moskowitz
*Attorney, Agent, or Firm*—Cushman, Darby & Cushman

[57] ABSTRACT

A device for amplifying an input optical signal includes an optical amplifier having a gain control region in which the input optical signal is amplified, a first detecting region for detecting the input optical signal, and a second detecting region for detecting an amplified optical signal. The gain of the optical amplifier is controlled by a gain control signal from a signal source. A controller, responsive to detecting signals from the first and second detecting regions, produces a source control signal which is supplied to control the signal source.

23 Claims, 6 Drawing Sheets

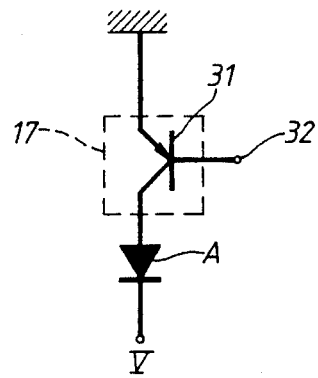
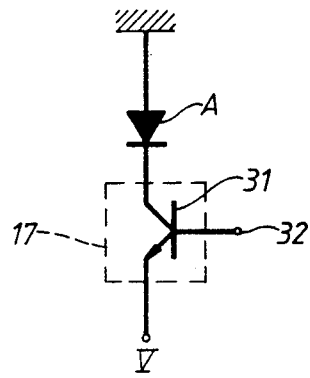
Fig. 3(a).  Fig. 3(b).
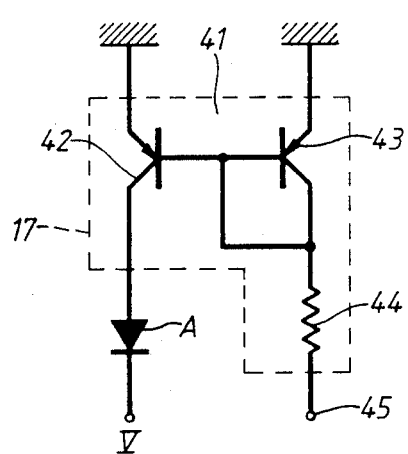
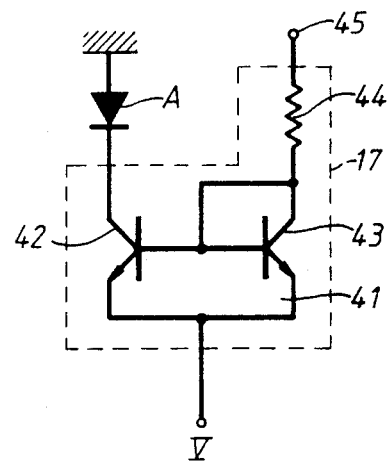
Fig. 4(a).  Fig. 4(b).

OPTICAL AMPLIFYING DEVICE

BACKGROUND OF THE INVENTION

1. Field of the Invention

This invention relates to optical amplifiers which may be used for optical communications and optical information processing, etc. More specifically, the invention relates to semiconductor optical amplifiers in which gain may be controlled.

2. Description of Related Art

Optical communication systems have recently attracted considerable interest. The majority of such systems employ electronic circuits. For example, in an optical repeater, an optical signal is converted into an electrical signal and the electrical signal is shaped and processed. Then, the electrical signal is converted back into an optical signal.

In such an optical repeater, the complicated processing causes the operation rate and phase changes, etc., of the electronic elements used in an electronic circuit, to become marginal as the transmission rate of the optical signal becomes faster. Therefore, it is desirable to form a compact and economical optical repeater with a high transmission rate by processing optical signals without conversion into electrical signals. It has also been known to form an optical amplifier to provide input signals to a pin photodiode instead of using a photodetector with gain, such as an avalanche photodetector.

When an optical amplifier is used as an optical repeater or photodetector, it is necessary to control the gain or the output level of the optical amplifier. However, in a known laser amplifier, the gain depends considerably on ambient temperature, wavelength and polarization of the input optical signal. Thus, the laser amplifier possibly oscillates even if the reflection factor from a face of the laser amplifier is restricted to be low. It is indispensable to control the gain of the optical amplifier in an actual system.

FIG. 13 shows a known optical amplifying device in which gain is controlled to ensure a constant output. In the device, current source 90 supplies a bias current to laser amplifier 91 through resistors Ra and Rb and inductance L. Differential amplifier 92 detects the voltage across resistor Ra. Also, amplifier 93 amplifies a signal corresponding to current variations at a point where inductance L and resistor Rb are connected. Multiplier 94 multiplies the signal from amplifier 93 by an output signal from differential amplifier 92. An output signal from multiplier 94 is supplied to filter 95.

Rectifier 96 rectifies the signal from filter 95 to obtain a direct current signal. Differential amplifier 97 amplifies a signal corresponding to the voltage difference between the direct current signal and a reference signal. Also, integrator 98 integrates the signal from differential amplifier 97. The signal from integrator 98 controls the bias current from current source 90 to ensure a constant output optical signal from laser amplifier 91.

However, in this device, oscillations are possible because the gain of laser amplifier 91 itself is not monitored. Therefore, optical amplifiers have not yet been put into practice and electronic circuits have been largely employed for amplification.

SUMMARY OF THE INVENTION

It is an object of the present invention to control the gain of an optical amplifier with high accuracy.

It is a further object of the present invention to provide an optical amplifying device in which the gain of an optical amplifier itself is monitored.

It is still a further object of the present invention to provide an optical amplifier which does not oscillate.

To achieve the above objects and in accordance with the purpose of the invention, as embodied and broadly described herein, the invention provides a device for amplifying an input optical signal. An optical amplifier assembly has a gain control portion for amplifying the input optical signal in accordance with a gain control signal. Also the optical amplifier assembly has a first detecting portion for detecting the input optical signal and a second detecting portion for detecting an amplified optical signal from the gain control portion. In response to the detected signals, a controlling circuit produces a source control signal. The gain control signal applied to the optical amplifier assembly is generated by a signal source in response to the source control signal from the controlling circuit and is supplied to the optical amplifier assembly.

BRIEF DESCRIPTION OF THE DRAWINGS

The present invention is best understood with reference to accompanying drawings in which:

FIGS. 3(a), 3(b), 4(a), and 4(b) are circuit diagrams for controlling a current source in the device shown in FIG. 2;

DETAILED DESCRIPTION OF THE PREFERRED EMBODIMENTS

Figure 1:
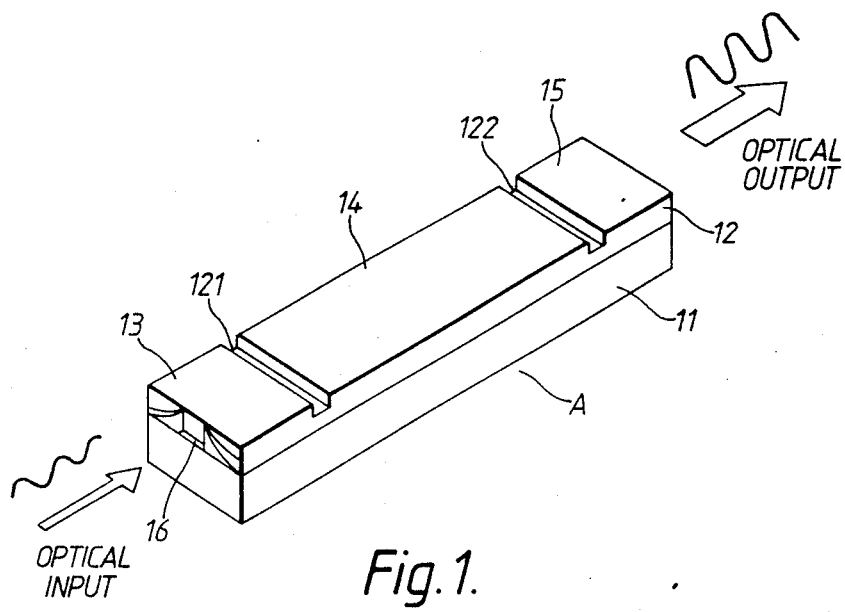
FIG. 1 is a schematic perspective view of a semiconductor laser amplifier used in an optical amplifying device according to one embodiment of this invention.

Referring to the accompanying drawings, several embodiments of the present invention will be described. In the drawings, the same numerals are applied to similar elements, and therefore the detailed description thereof is not repeated.

As shown in FIG. 1, semiconductor laser amplifier A is used in an optical amplifying device. Semiconductor laser amplifier A is a traveling wave type laser amplifier with its reflection factor typically set to less than about 0.1% at a face of the amplifier. Semiconductor laser amplifier A includes cladding layers 11 and 12. Upper cladding layer 12 has a three electrode structure which comprises first and second detecting regions 13 and 15 and a gain control region 14. Those regions 13, 14 and 15 are divided by grooves 121 and 122 to cut off currents in cladding layer 12.

First and second detecting regions 13 and 15 detect optical signals which propagate in active layer 16 between cladding layers 11 and 12. Gain control region 14 amplifies an input optical signal.

Various processes may be employed to divide semiconductor laser A into three regions 13, 14 and 15. As simple examples, an upper part of cladding layer 12 may be etched or ion implanted. The reflection factor at the face of semiconductor laser amplifier A is small enough to allow the input optical signal in laser amplifier A to propagate in active layer 16, to be amplified and to allow an amplified optical signal to be output from laser amplifier A without reflecting at the face of laser amplifier A. The ratio between the optical signals in first and second detecting regions 13 and 15 represents the gain of laser amplifier A.

Figure 2:
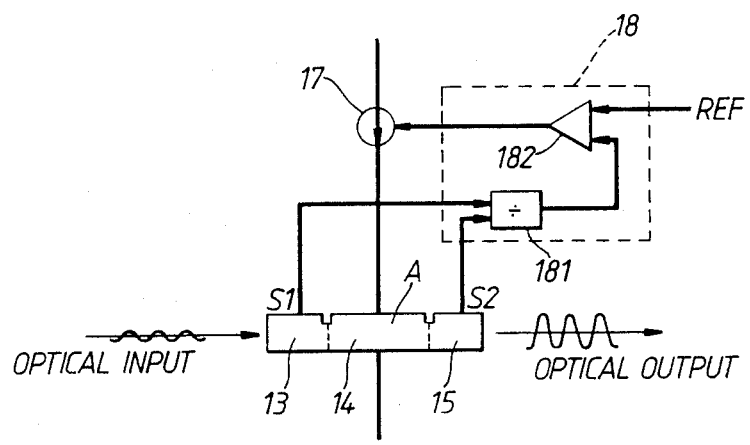
FIG. 2 is a schematic block diagram of an optical amplifying device according to one embodiment of this invention.

FIG. 2 illustrates laser amplifier A, current source 17 for generating a gain control signal to control the gain of laser amplifier A and controller 18 for generating a source control signal to control the gain control signal. Electrical signals (currents) S1 and S2 are obtained from detecting regions 13 and 15 through electrodes formed on the cladding layer 12 in accordance with the input optical signal and an output optical signal. Controller 18 has divider 181 and differential amplifier 182. Divider 181 generates a signal corresponding to the ratio S2/S1, from electrical signals S1 and S2, which ratio signal is supplied to differential amplifier 182. A signal corresponding to the difference between the ratio S2/S1 and a reference value is amplified to produce a source control signal.

Current source 17 comprises transistor 31, as shown in FIG. 3(a) or 3(b), with its base terminal 32 being provided with the source control signal from differential amplifier 182. A gain control current flows in the collector of transistor 31 in accordance with the source control signal controlling a base current of transistor 31. The gain control current is supplied to gain control region 14 in laser amplifier A through an electrode (not shown). As a result, laser amplifier A is controlled so that its gain is constant. As shown in the alternative arrangements of FIGS. 4(a) and 4(b), current source 17 shown in FIG. 2 includes resistor 44 and current mirror 41 including transistors 42 and 43, with each emitter being connected commonly, each base being connected commonly, and the base and collector of transistor 43 being connected commonly. The source control signal from differential amplifier 182 is supplied to terminal 45. Current mirror 41 produces an output current substantially equal to drive current from the source control signal since the characteristics of transistor 42 are similar to those of transistor 43. Thus, the gain control current, which is the collector current of transistor 42, becomes substantially equal to the collector current of transistor 43, corresponding to the source control signal.

Figure 5:
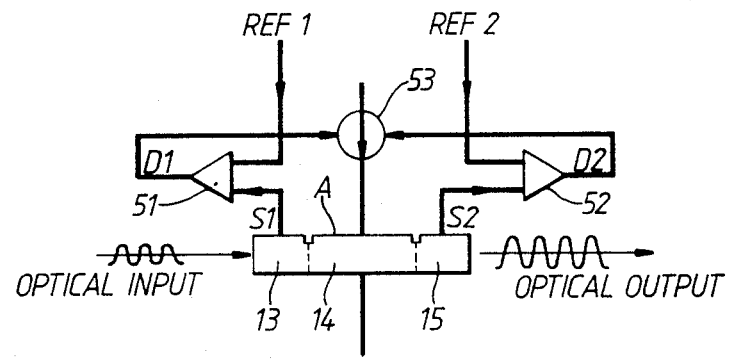
FIG. 5 is a schematic diagram of an optical amplifying device according to another embodiment of this invention.

FIG. 5 shows an optical amplifying device which produces a constant output optical signal. The device has two differential amplifiers 51 and 52 which supply output signals to current source 53. Electrical signal S1, corresponding to the input optical signal in first detecting region 13, is supplied to differential amplifier 51 which generates first source control signal D1 corresponding to the difference between a level of electrical signal S1 and reference level REF1. Electrical signal S2, corresponding to the output optical signal in second detecting region 15, is supplied to differential amplifier 52 which generates second source control signal D2 corresponding to the difference between a level of electrical signal S2 and reference level REF2 Reference level REF1 corresponds to a substantial minimum level of the input optical signal that causes the gain of amplifier 52 to be within acceptable limits while still producing the desired output level. Reference level REF2 corresponds to a desired constant level of the output optical signal. Current source 53 is provided with signals D1 and D2.

Figures 6A, 6B:
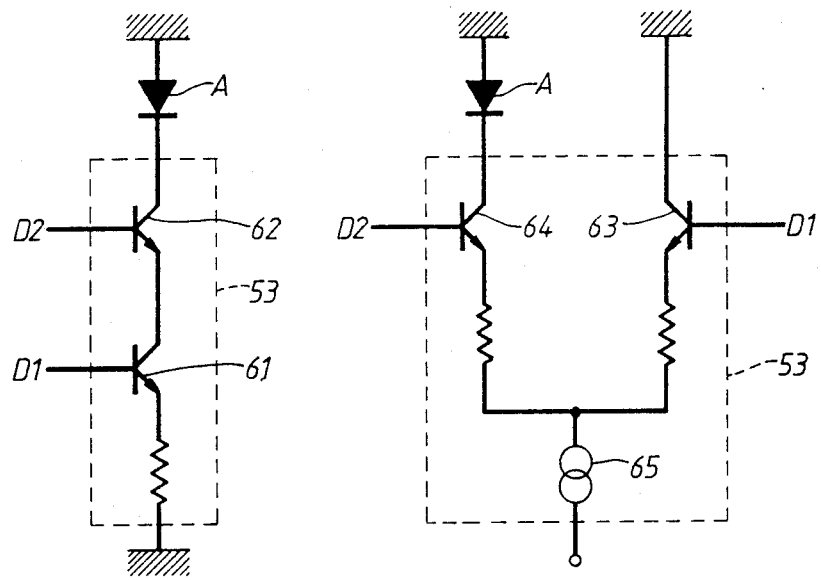
FIGS. 6(a), 6(b) and 7 are circuit diagrams for controlling a current source of a device shown in FIG. 5.

As shown in FIG. 6(a), current source 53 can include two transistors 61 and 62 in series. Transistor 62, with its base being provided with signal D2, produces the gain control signal for controlling the gain in laser amplifier A so that the output optical signal has a constant level corresponding to reference level REF2. Transistor 61, normally conductive, with its base being provided with signal D1, produces a gain control signal for decreasing the gain in laser amplifier A to avoid oscillation of laser amplifier A when the level of electrical signal S1 is less than reference level REF1. This limits the amount of the gain control signal which can be produced by transistor 62 when the input optical signal is too low. If the input optical signal were not monitored, laser amplifier A might oscillate when the input optical signal is very low since the gain of a amplifier A becomes too high while maintaining the optical signal at a constant level. In the present device, differential amplifier 51 and transistor 61 prevent oscillation of amplifier A by limiting the amount of the gain control signal from transistor 62. Laser amplifier A generators noise around the threshold at which it oscillates as a result of high gain. The present device is capable of avoiding such a condition.

As shown in FIG. 6(b), current source 53 may include transistors 63 and 64, each emitter being connected to constant current source 65 commonly through a resistor. In this case, the gain control signal, which is a collector current in transistor 64, becomes substantially equal to the difference between the levels of signals D1 and D2. Also, oscillation of laser amplifier A is prevented when the level of the input optical signal is very low, since a low input optical signal level increases the level of D1.

Figure 7:
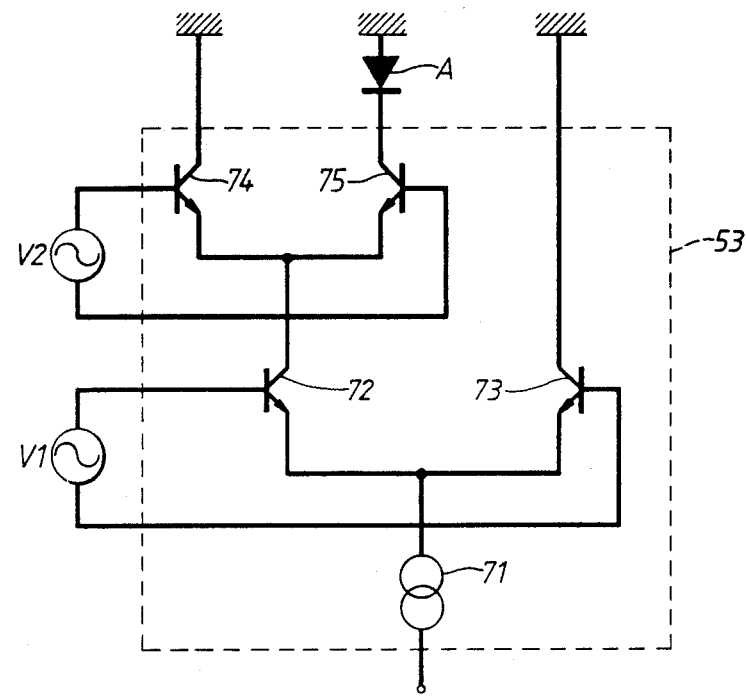

FIG. 7 shows another circuit diagram for current source 53 shown in FIG. 5. Current source 53 includes constant current source 71 and transistors 72, 73, 74 and 75. Emitters of transistors 72 and 73 are commonly connected to constant current source 71. Output voltage V1 from differential amplifier 51 is applied across bases of transistors 72 and 73.

When a level of electrical signal 51 is less than reference level REF1, the collector current of transistor 72, which is generated as the gain control signal in accordance with voltage V1, decreases the gain of laser amplifier A in order to prevent the oscillation of amplifier A in a similar manner as in FIG. 6(a). Also, the emitters of transistors 74 and 75 are commonly connected to the collector of transistor 72.

Output voltage V2 from differential amplifier 52 is applied across the bases of transistors 74 and 75. The collector current of transistor 75 is generated as the gain control signal in accordance with voltage V2 corresponding to the difference between a level of electrical signal S2 and reference level REF2. Laser amplifier A is controlled by the collector current of transistor 75 so that the level of the output optical signal becomes a constant level as long as the level of the input optical signal is sufficiently high.

Figure 8:
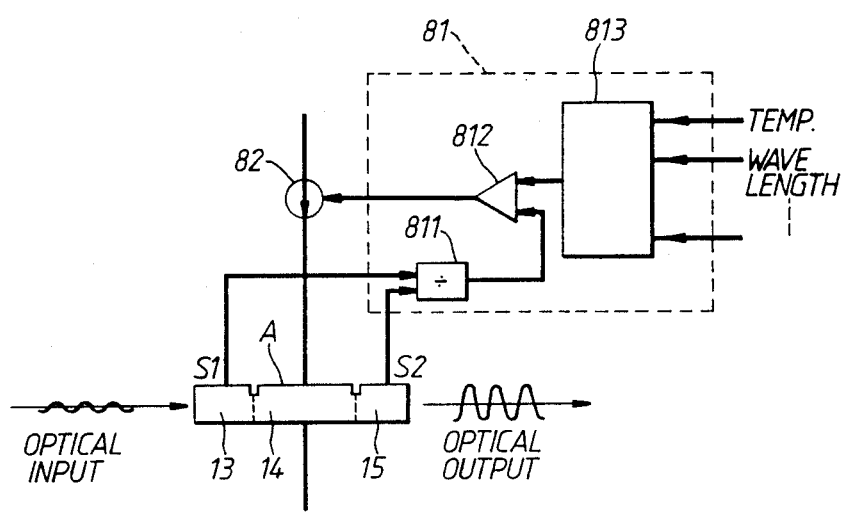
FIG. 8 is a schematic diagram of an optical amplifying device according to still another embodiment of this invention.

FIG. 8 shows an optical amplifying device according to another embodiment of this invention. Controller 81 has divider 811 which generates a signal related to the ratio S2/S1 from electrical signals S1 and S2. An output signal from divider 811 is supplied to differential amplifier 812 which produces the source control signal for controlling current source 82. Controller 81 also includes processing circuit 813 which has a memory in which information about the gain characteristics of laser amplifier A with respect to temperature, the wavelength of the input optical signal and the desired gain level, etc., are stored. For example, predetermined reference levels corresponding to temperatures and wavelength may be stored in the memory of processing circuit 813.

Information about the present temperature and present wavelength of the input optical signal are supplied to processing circuit 813 and stored in the memory. The output signal from processing circuit 813 is supplied to differential amplifier 812 which produces the source control signal corresponding to the difference between output signals from divider 811 and processing circuit 813. Current source 82 may be formed the same as current source 17 shown in FIGS. 3(a), 3(b), 4(a) or 4(b). Divider 811 and differential amplifier 812 are analog circuits. Processing circuit 813 is a digital circuit with a D/A converter (not shown) to supply analog signals to differential amplifier 812.

However, controller 81 may be replaced with an digital circuit including A/D converters for converting signals S1 and S2 into digital signals to be processed with other control information. Current sources 17, 53 and 82 may include a digital circuit for controlling the gain control current. Feed forward control of gain with respect to temperature, wavelength, etc., is possible with controller 81. Also, various control philosophies may be implemented such as maintaining constant gain, maintaining a constant output optical signal, preventing oscillation of laser amplifier A as described with respect to FIG. 5 or obtaining a maximum gain for a specified level of the input optical signal at a specified temperature, etc.

Figure 9:
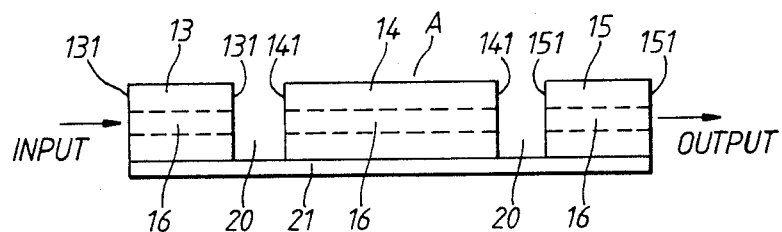
FIG. 9 is a schematic front view of a laser amplifier used in an optical amplifying device according to another embodiment of this invention.

Semiconductor laser amplifier A may have a structure shown in FIG. 9. Regions 13, 14 and 15 are separated by spaces 20 on a substrate 21 and each include an active area 16. Dielectric multilayers 131, 141 and 151 are formed on each of regions 13, 14 and 15 in order to create a low reflection factor.

Figure 10:
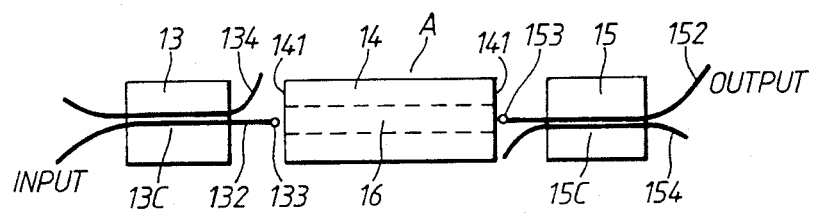
FIG. 10 is a schematic plan view of a laser amplifier used in an optical amplifying device according to a further embodiment of this invention.

In FIG. 10, first and second detecting regions 13 and 15 comprise optical couplers 13C and 15C. Coupler 13C has optical fiber 132 which supplies the input optical signal to gain control region 14 through spherical lens 133 formed at an end of fiber 132. Coupler 13C also has optical fiber 134 which receives a part of the input optical signal in accordance with a specified distributing ratio for detecting the magnitude of the input optical signal.

Coupler 15C has optical fiber 152 which is provided with the output optical signal through spherical lens 153 formed at an end of fiber 153. Coupler 15C also has optical fiber 154 which receives a part of the output optical signal in accordance with a specified distributing ratio for detecting the magnitude of the output optical signal.

Figure 11:
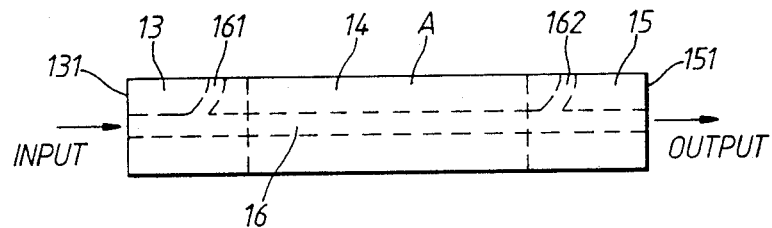
FIG. 11 is a schematic plan view of a laser amplifier used in an optical amplifying device according to still a further embodiment of this invention.
Figure 12:
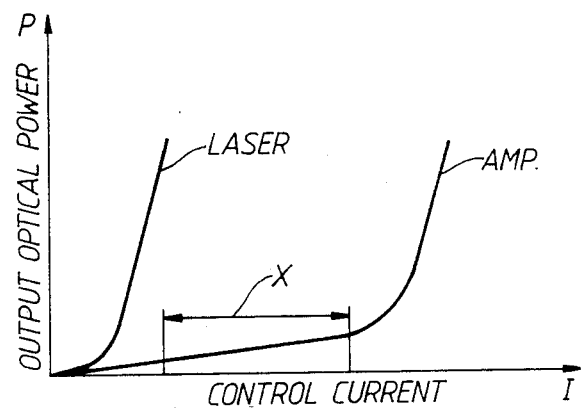
FIG. 12 is a graph showing characteristics of a semiconductor laser amplifier.
Figure 13:
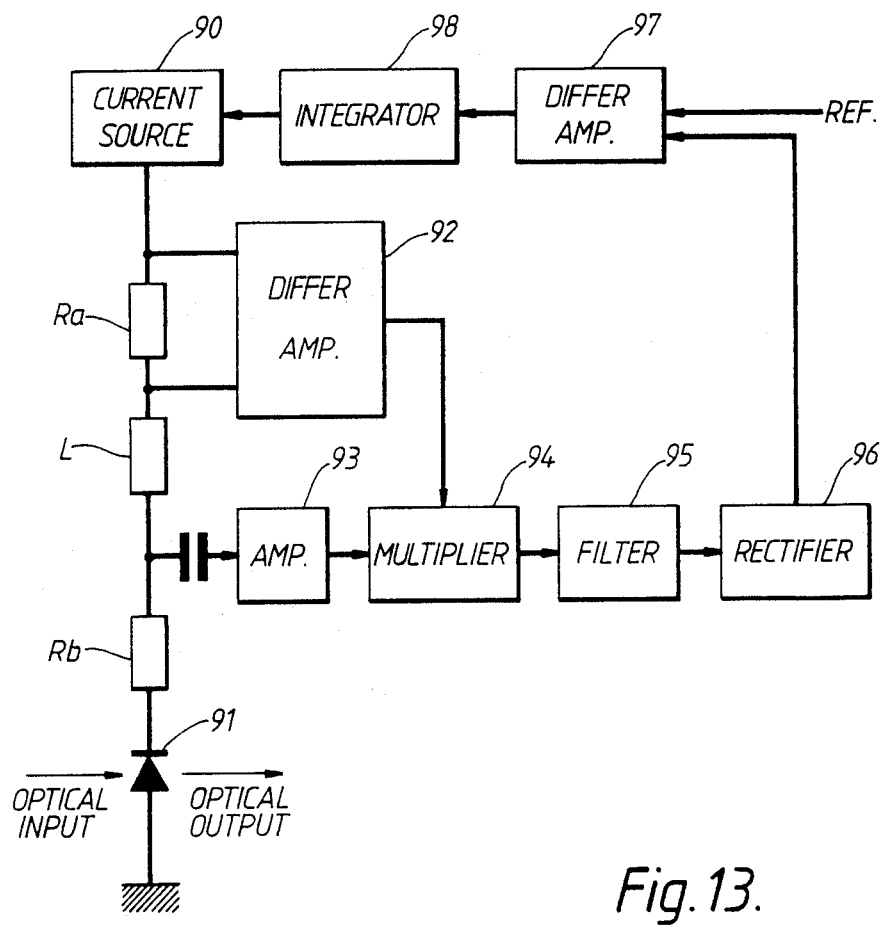
FIG. 13 is a block diagram of a known optical amplifying device.

Semiconductor laser amplifier A may also be formed as shown in FIG. 11. Active layer 16 of region 13 has branch 161 which diverts a portion of the input in accordance with a specified distributing ratio for detecting the input optical signal. Branch 162 of region 15 diverts a portion of the output signal in accordance with a specified distributing ratio for detecting the output optical signal. FIG. 12 shows relationships between output optical power P and control current I in a semiconductor laser operating in different modes. Normally, a laser produces large optical power in response to a small control current due to a high reflection factor. When the semiconductor laser is used as an amplifier, it may be operated within control current range X to avoid reflection.

According to the present invention, it is possible to monitor and control the gain of the optical amplifier itself with a high accuracy and, at the same time, suppress noise. Moreover, it is possible to form a compact and economical optical repeater without converting an optical signal into an electrical signal and vis-a-vis. Therefore, it is possible with the present invention to provide an optical amplifying device that is suitable for optical communications and optical information processing, etc.

What is claimed is:

1. A device for amplifying an input optical signal comprising:
   optical amplifying means having a gain control portion for amplifying the input optical signal to produce an amplified optical signal in accordance with a gain control signal, and having a first detecting portion for detecting the input optical signal and a second detecting portion for detecting the amplified optical signal from the gain control portion;
   controlling means responsive to detected signals from the first and second detecting portions for producing a source control signal related thereto; and
   signal source means, coupled to the amplifying means, for generating the gain control signal corresponding to the source control signal.

2. The device of claim 1, wherein the optical amplifying means includes means for restricting a reflection factor of the optical signals.

3. The device of claim 1, wherein the first detecting portion of the optical amplifying means includes means for generating a first electrical signal corresponding to the input optical signal and the second detecting portion includes means for generating a second electrical signal corresponding to the amplified optical signal.

4. The device of claim 1, wherein the controlling means includes:
   divider means for generating a signal corresponding to a ratio of levels of the input optical signal and the amplified optical signal as detected by the first and second detecting portions, respectively; and
   differential amplifier means for producing the source control signal corresponding to the difference between the ratio and a reference value.

5. The device of claim 3, wherein the controlling means includes:
   divider means for generating a ratio signal corresponding to a ratio of levels of the first and second electrical signals; and differential amplifier means for producing the source control signal corresponding to the difference between the ratio and a reference value.

6. The device of claim 1, where in the signal source means includes a transistor for producing a gain control current, corresponding to the source control signal, as the gain control signal.

7. The device of claim 1, wherein the controlling means includes means for controlling the gain control signal from the signal source means so that a gain of the optical amplifying means becomes a constant value.

8. The device of claim 1, wherein the signal source means includes means for producing the gain control signal substantially equal to the source control signal.

9. The device of claim 8, wherein the signal source means includes two transistors, each emitter of the transistors being commonly connected, each base of the transistors being commonly connected, a collector of one of the transistors, which is provided with the source control signal, being connected to the base of the same transistor, and a collector of the other of the transistors producing the gain control signal.

10. The device of claim 1, wherein the controlling means includes means for controlling the gain control signal form the signal source means so that the amplified optical signal becomes a constant value.

11. The device of claim 10, wherein the controlling means includes a differential amplifier for producing the source control signal corresponding to the difference between a level of the detected signal form the first detecting portion and a first reference level.

12. The device of claim 10, wherein the controlling means includes a differential amplifier for producing the source control signal corresponding to the difference between a level of the detected signal from the second detecting portion and a second reference level.

13. The device of claim 1, wherein the controlling means includes means for producing a first source control signal corresponding to the difference between a level of the detected signal from the first detecting portion and a first reference level, and for producing a second source control signal corresponding to the difference between a level of the detected signal from the second detecting portion and a second reference level, the first and second source control signals controlling the signal source means.

14. The device of claim 13, wherein the signal source means includes:
a first transistor having a base provided with the first source control signal; and
a second transistor having a base being provided with the second source control signal, an emitter being connected to a collector of the first transistor, and a collector being connected to the gain control portion of the optical amplifying means.

15. The device of claim 13, wherein the signal source means includes means for producing the gain control signal substantially equal to the difference between levels of the first and second source control signals.

16. The device of claim 13, wherein the signal source means includes means for producing a first gain control signal corresponding to the first source control signal, and for producing a second gain control signal corresponding to the second source control signal, the first and second gain control signals controlling the optical amplifying means.

17. The device of claim !, wherein the controlling means includes:
a divider for generating a signal corresponding to a ratio of levels of the input optical signal and the amplified optical signal;
processing means for producing a predetermined level corresponding to characteristics of the optical amplifying means; and
a differential amplifier for producing the source control signal corresponding to the difference between a level of the ratio signal and the predetermined level.

18. The device of claim 1, wherein the optical amplifying means includes a semiconductor laser amplifier having the gain control portion and the first and second detecting portions, each portion being separated from the others by space.

19. The device of claim 18, wherein the semiconductor laser amplifier has dielectric multilayers formed on faces of the portions.

20. The device of claim 1, wherein the first detecting region comprises an optical coupler having optical fibers for dividing the input optical signal into portions.

21. The device of claim !, wherein the second detecting portion comprises an optical coupler having optical fibers for dividing the amplified optical signal into portions.

22. The device of claim 1, wherein the optical amplifying means includes a semiconductor laser amplifier having an active layer provided with the input optical signal, a first branch of the active layer dividing the input optical signal, and a second branch of the active layer dividing the amplified optical signal.

23. The device of claim 1, wherein the optical amplifying means comprises a semiconductor laser amplifier including cladding layers and an active layer between the cladding layers, one of the cladding layers having grooves between each detecting portion and the gain control portion for cutting off currents in the cladding layer.

* * * * *